US010680484B2

(12) United States Patent
Baucé et al.

(10) Patent No.: US 10,680,484 B2
(45) Date of Patent: Jun. 9, 2020

(54) METHOD OF PROTECTING LAMINATION STACKS OF A COMPONENT OF AN ELECTRIC MACHINE AND COMPONENT OBTAINED BY THE METHOD

(71) Applicants: Yvon Baucé, Les Higues (FR); Eduardo Carrasco, Saint Etienne sous Bailleul (FR); Erwan Salahun, Groix (FR)

(72) Inventors: Yvon Baucé, Les Higues (FR); Eduardo Carrasco, Saint Etienne sous Bailleul (FR); Erwan Salahun, Groix (FR)

(73) Assignee: SKF MAGNETIC MECHATRONICS, Saint-Marcel (FR)

( * ) Notice: Subject to any disclaimer, the term of this patent is extended or adjusted under 35 U.S.C. 154(b) by 835 days.

(21) Appl. No.: 15/005,273

(22) Filed: Jan. 25, 2016

(65) Prior Publication Data

US 2016/0226332 A1 Aug. 4, 2016

(30) Foreign Application Priority Data

Feb. 3, 2015 (EP) .................................... 15305157

(51) Int. Cl.
*H02K 5/12* (2006.01)
*H02K 7/09* (2006.01)
(Continued)

(52) U.S. Cl.
CPC ............... *H02K 5/12* (2013.01); *C23C 16/04* (2013.01); *H01F 3/02* (2013.01); *H01F 41/0233* (2013.01);
(Continued)

(58) Field of Classification Search
CPC ......... C23C 16/24; C23C 16/26; C23C 16/27; C23C 16/279; C23C 16/30; C23C 16/32;
(Continued)

(56) References Cited

U.S. PATENT DOCUMENTS 5,948,379 A * 9/1999 Konig ............... C23C 16/45578
204/164
6,664,685 B2 12/2003 Ameen et al.
(Continued)

FOREIGN PATENT DOCUMENTS

| CA | 2624347 A1 | 9/2008 |
| DE | 102010062722 A1 | 6/2012 |
| WO | WO2012-076276 | * 6/2012 |

OTHER PUBLICATIONS

Ewert WO2012-076276 Jun. 2012 English translation (Year: 2012).*

*Primary Examiner* — Joseph A Miller, Jr.
(74) *Attorney, Agent, or Firm* — J-Tek Law PLLC; Scott T. Wakeman; Mark A. Ussai

(57) ABSTRACT

A method of protecting ferromagnetic lamination stacks of a component of an electric machine, comprises the following steps: creating a component module by arranging a laminations stack of ferromagnetic sheets into a housing, (b) protecting locations of the component module where coating is unwanted, (c) inserting the component module into a hermetic chamber receiving an ionized gas, (d) polarizing the component module to submit a fixed electric potential to the component module, (e) depositing a thin layer of protective coating on the laminations stack of ferromagnetic sheets through a method of Plasma Enhanced Chemical Vapor Deposition (PECVD) at a temperature lower than 150° C., (f) monitoring the deposition homogeneity and deposition thickness of the thin layer of protective coating (Continued)

until desired thickness, and (g) rectifying the surface of the thin layer of protective coating to have a uniform protective layer.

8 Claims, 2 Drawing Sheets

(51) Int. Cl.
*H02K 15/02* (2006.01)
*H02K 15/12* (2006.01)
*H01F 3/02* (2006.01)
*C23C 16/04* (2006.01)
*H01F 41/02* (2006.01)

(52) U.S. Cl.
CPC .............. *H02K 7/09* (2013.01); *H02K 15/02* (2013.01); *H02K 15/12* (2013.01)

(58) Field of Classification Search
CPC ... C23C 16/325; C23C 16/44; C23C 16/4414; C23C 16/52; C23C 16/00; C23C 16/04; H02K 15/10; H02K 15/12; H02K 7/09

USPC ........................................................ 310/90.5
See application file for complete search history.

(56) References Cited

U.S. PATENT DOCUMENTS

| | | | |
|---|---|---|---|
| 2003/0227363 A1* | 12/2003 | Leisten | H01F 3/14 336/178 |
| 2005/0023910 A1* | 2/2005 | Lukenich | H02K 3/522 310/71 |
| 2007/0013241 A1* | 1/2007 | Schiferl | H02K 1/32 310/54 |
| 2007/0178229 A1* | 8/2007 | Bergendahl | C23C 16/4417 427/127 |
| 2014/0241914 A1* | 8/2014 | Ojima | H02K 1/276 417/410.1 |

* cited by examiner

METHOD OF PROTECTING LAMINATION STACKS OF A COMPONENT OF AN ELECTRIC MACHINE AND COMPONENT OBTAINED BY THE METHOD

CROSS REFERENCE TO RELATED APPLICATION

This is a Non-Provisional Patent Application, filed under the Paris Convention, claiming the benefit of European Patent (EP) Patent Application Number 15305157.8, filed on Feb. 3, 2015 (03.02.2015), which is incorporated herein by reference in its entirety.

TECHNICAL FIELD OF THE INVENTION

The present invention relates to a method of protecting ferromagnetic lamination stacks of a component of an electric machine from corrosion due to sour environment and from mechanical scratches that may occur during handling stage.

The invention further relates to a component module obtained by such method.

BACKGROUND OF THE INVENTION

Electric machines such as electric motors, active magnetic bearings or electromagnetic sensors are sometimes used in harsh environment. Corrosion due to presence of sulphide, water, mercury, hydrocarbons in upstream gas may occur on lamination stacks of either a rotor or a stator of an electric machine. Such laminations may be made of ferromagnetic material (Si-Iron, Co-Iron, Ni-Iron . . . ). It is therefore necessary to form a protective layer between a lamination stack and a severe environment.

Furthermore scratches may occur during handling of the elements of the electric machine. If such scratches are made on sensor's lamination rotor stacks, rotating harmonics are created and picked up by the sensor. It results in disturbance of all the control of an associated electric machine.

It is therefore desirable that a rotor's stack of laminations be hardened and better protected to diminish harmonic amplitude or even avoid harmonics (case of very low impact of mechanical scratch on the lamination stack).

To avoid problems caused by harsh environment it has been envisaged to use an anti-corrosive painting. However, tests have demonstrated that there is a lack of paint adhesion when such anti-corrosive painting is used on a rotor and the rotor is spinning at high rotation levels.

Patent document CA 2624347 A1 relates to a rotor shaft assembly for magnetic bearing for use in corrosive environment. The rotor shaft is formed of parts of a ferromagnetic material comprising a plurality of ferromagnetic rotor laminations disposed on the rotor shaft. A barrier layer, by anti-corrosive paint, is formed on selected exposed surfaces of the rotor shaft and is effective to resist corrosion. The barrier layer is formed of a material selected from the group consisting of epoxies (filled epoxies, filled silicones . . . ), fluoropolymer (PFA, ETFE, ECTFE, PTFE, PFA, FEP, MFA, PVDF . . . ), oxide conversion material, phosphate conversion material, chromate conversion material, a di (4-hydroxyphenol) isopropylidene diglcycidyl ether-di (4-hydroxyphenol) isopropylidene copolymer. The barrier is applied at room temperature with a brush or a spray. The adherence of the barrier strongly depends on the surface preparation of the surface of the laminations. Such deposition method induces that thickness of the barrier layer is relatively thick: indeed, this thickness is comprised between 178 µm and 406 µm. In practice, experiments have demonstrated that coating tend to be damaged when rotor is spinning at high speeds level.

It is therefore an object of the present invention to improve the protection of all ferromagnetic lamination stacks (rotor and stator parts) of an electric machine, especially an active magnetic bearing, when the electromagnetic components are in contact with a sour environment. Moreover, coating material and coating method are intended to prevent drawbacks especially when the rotor is spinning at high speed.

SUMMARY OF THE INVENTION

The technical problem to be solved is to provide an electric machine having protected lamination stacks. Moreover, the present invention aims at specifying a method of coating in order to remedy the above-mentioned problems or drawbacks.

More specifically the invention aims at more efficiently protecting lamination stacks of an electric machine which is in contact with a high corrosive environment.

In particular, the invention safeguards the easiness of a manufacturing process, enabling a high serial manufacturing process.

The invention is defined in the appended claims.

The invention more specifically relates to a method of protecting ferromagnetic lamination stacks of a component of an electric machine, comprising the following steps:
  a) creating a component module by arranging a laminations stack of ferromagnetic sheets into a metallic housing,
  b) protecting locations of the component module where coating is unwanted
  c) inserting the component module into a hermetic chamber receiving an ionized gas,
  d) polarizing the component module to submit a fixed electrical potential to the component module,
  e) depositing a thin layer of protective coating on the lamination stack of-ferromagnetic sheets through a method of Plasma Enhanced Chemical Vapor Deposition (PECVD) at a temperature lower than 150° C.,
  f) monitoring the deposition homogeneity and deposition thickness of the thin layer of protective coating until desired thickness, and
  g) rectifying the surface of the thin layer of protective coating to have a uniform protective layer.

According to a specific embodiment, the method further comprises a preliminary step consisting in surface preparation of the component module before inserting the component module into the hermetic chamber receiving an ionized gas.

Surface preparation preferably comprises at least one of the methods consisting in micro sandblasting, shot blasting, skimming and chemical attack, but other adapted methods could also be applied.

The thickness of the protective coating is preferably comprised between 5 micrometers and 50 micrometers depending of the kind of desired protection (hardness protection or anti corrosive protection).

The protective coating may be made of an ultrapure silicon carbide coating.

Alternatively, the protective coating is made of a diamond like carbon coating.

The lamination stack of ferromagnetic sheets may be made of glued or stamped Si-Iron laminations.

The invention further relates to a component module of an electric machine comprising a laminations stack of ferromagnetic sheets provided in a metallic housing, wherein it comprises a thin layer of protective coating deposited on the laminations stack of ferromagnetic sheets through a method of Plasma Enhanced Chemical Vapor Deposition (PECVD), the thin layer of protective coating having a rectified surface.

The component module according to the invention may constitute a rotor or a stator of an active magnetic bearing.

The component module may also constitute a rotor or a stator of a position sensor for an active magnetic bearing.

DETAILED DESCRIPTION OF SOME EMBODIMENTS

The present invention will be described in connection with preferred embodiments which are given by way of examples.

A typical arrangement of a first embodiment of the invention is illustrated in FIGS. 1 to 4.

Figure 1:
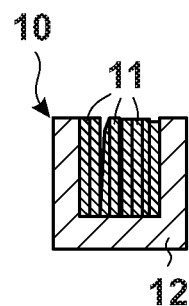
FIG. 1 is a sectional view of a stack of laminations of a rotor or a stator component of an electric machine such as an active magnetic bearing according to a first step of the manufacturing process of the present invention, this sketch being a part of lamination stack with metallic spacers.

As shown in FIG. 1, in order to constitute a component of an electric machine comprising a laminations stack of ferromagnetic sheets 11 with metallic spacers, a component module 10 is created by arranging a laminations stack of ferromagnetic sheets 11 into a housing 12.

Figure 2:
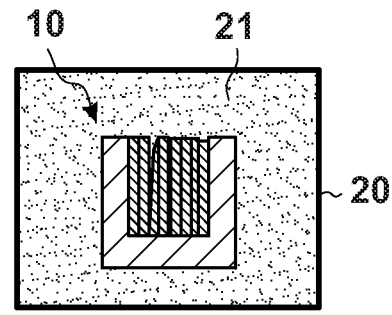
FIG. 2 is a sectional view of a stack of laminations of a rotor or a stator component of an electric machine placed in a chamber filled with ionized gas according to a second step of the manufacturing process of the present invention.

The component module 10 is then inserted into a hermetic chamber 20 receiving a specific ionized gas 21 (FIG. 2).

Figure 3:
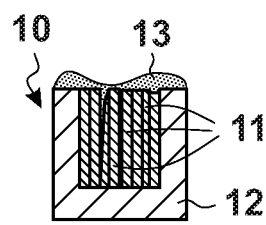
FIG. 3 is a sectional view of a stack of laminations of a rotor or a stator component of an electric machine according to a third step of the manufacturing process of the present invention, where a protecting layer is deposited with a material growth, material growth depending strongly of the nature of ionized gas in chamber and of the coating desired.

In the chamber 20 a thin layer of protective coating 13 is deposited on the surface of lamination's stack of ferromagnetic sheets 11 through a method of Plasma Enhanced Chemical Vapor Deposition (PECVD) at a temperature lower than 150° C. to obtain a module 10 as illustrated in FIG. 3.

The homogeneity and thickness of the thin layer of protective coating 13 is then monitored either directly or via a number of samples associated with the component module 10.

Figure 4:
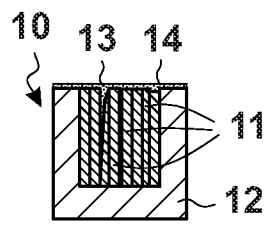
FIG. 4 is a sectional view of a stack of laminations of a rotor or a stator component of an electric machine according to a fourth step of the manufacturing process of the present invention, where a protecting layer has been deposited with a material growth and has been rectified, the thickness of coating material being a consequence of the rectification stage.

Finally, the surface 14 of the thin layer of protective coating 13 is mechanically rectified (see FIG. 4).

Figure 5:
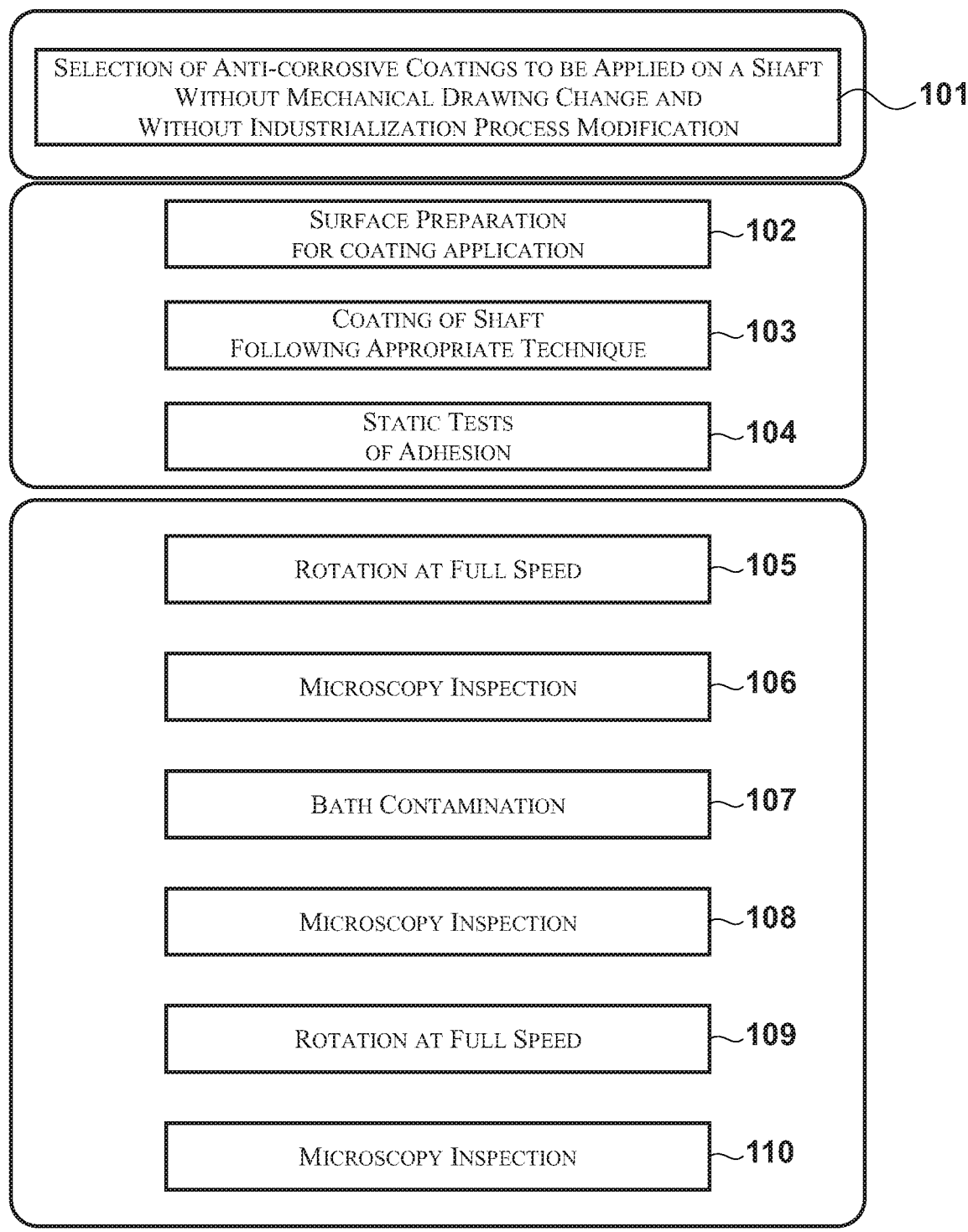
FIG. 5 is a flowchart illustrating the different steps of a manufacturing process of a stack of laminations of a rotor or a stator component of an electric machine according to the present invention.

FIG. 5 is a general flowchart illustrating the main steps of a method according to the present invention. This flowchart can be applied for anti-corrosive coating and for hardness improvement.

At step 101 a selection is made of anti-corrosive coatings to be applied on ferromagnetic lamination stack without mechanical drawing change and without traditional industrialization process modification.

According to the invention anti-corrosive coatings 13 are preferably an ultrapure silicon carbide coating or a diamond like carbon coating or even a combination of both coatings.

At step 102 a surface preparation is made for coating application.

For example such surface preparation may consist in micro sandblasting the stack of laminations of ferromagnetic sheets 11 before inserting the component module 10 into a hermetic chamber 20 receiving an ionized gas 21. The micro sandblasting may comprise projecting fine particles of silicate having a diameter of about 80 micrometers. Goal of this step is to prepare surface to accept growing thanks to ionized gas.

At step 103, a coating is deposited on the component module, following an appropriate technique.

For example, the thin layer of protective coating 13 is deposited on the laminations stack of ferromagnetic sheets 11 located in a hermetic chamber 20 receiving an ionized gas 21 through a method of Plasma Enhanced Chemical Vapor Deposition (PECVD) at a temperature lower than 150° C. This temperature is critical since with upper temperature, fretting is strongly affected. The duration of the exposure of the component module to the plasma in the hermetic chamber 20 determines the thickness of the protective coating. Later the thin layer of deposited protective coating 13 is rectified to have a uniform surface 14.

The thickness of the protective coating 13 is preferably comprised between 5 micrometers and 50 micrometers. With such thicknesses the electromagnetic performance of a machine is not affected by the protective coating 13. There is no need to redesign the machine.

The laminations stack of ferromagnetic sheets 11 may comprise glued or stamped Si-Iron laminations.

The protective coating 13 may be made of an ultrapure silicon carbide coating, such as the coating called SilicoMax™ coating.

Alternatively the protective coating 13 from mechanical damages is made of a diamond like carbon coating, such as the coating called UltraC™ Diamond coating.

At step 104, static tests of adhesion are conducted on the component module.

The invention may apply to rotor or stator parts of an active magnetic bearing or of an inductive sensor associated with an active magnetic bearing.

The invention may further apply to components of an electric motor or generator.

In the rest of the description the examples of a component module consisting in a rotor of an active magnetic bearing or of a component module consisting in a rotor of a sensor associated with an active magnetic bearing will be more specifically taken into consideration.

At step 105 the shaft supporting the component module is rotated at full speed.

At step 106 a microscopy inspection is carried out on the protective coating 13.

At step 107 the component module is subjected to a bath contamination with the aggressive atmosphere (hydrocarbons, Mercury, H2S . . . ) which will be created during normal operation.

At step 108 a new microscopy inspection is carried out on the protective coating 13.

At step 109 the shaft supporting the component module is again rotated at full speed.

At step 110 a microscopy inspection is again carried out on the protective coating 13.

Finally after the steps of monitoring the homogeneity and thickness of the thin layer of protective coating 13, according to a final step, the surface 14 of the thin layer of protective coating 13 is rectified.

Thus to protect the lamination stacks of a rotor or a stator placed in a harsh environment and to prevent them from being corroded or otherwise damaged, e.g. by scratching during manipulation, a protective coating is deposited on the lamination stacks by plasma technique to increase robustness of these stacks to external stress.

The method according to the present invention and the resulting component module present a number of advantages. In particular there is no need to change the design of the component modules which are manufactured according to the invention and the reduced thickness of the added protective coating does not affect the magnetic properties of the component modules.

The component modules manufactured according to the invention may be used in sour environment having for example the following properties:

Pressure range: 1-200 bar
Temperature range: −20/180° C.
Gas flow: less than 400 m/s
Particles size in the gas: 50 micrometers
Particles quantity in the gas: 5 ppm
Typical composition of the gas:
CH4: 60-95% Mol
Hydrocarbons (up to C10): few percent % Mol
CO2: less than 5% % Mol
H2O: saturated
PH2S: less than 0.1 bar
Mercury: less than 250 μg/Nm3
MEG or DEG or TEG or Methanol: less than 50 ppm/Mol Generally speaking, the invention increases performance of the manufactured component module with a method which may be easily implemented.

Although preferred embodiments have been shown and described, it should be understood that any changes and modifications may be made therein without departing from the scope of the invention as defined in the appended claims. Thus the features of the different embodiments may be combined.

What is claimed is:

1. A method for protecting a ferromagnetic lamination stack of a component of an electric machine, comprising:
    a) providing a metallic housing having a side wall and an interior and an opening extending from the side wall into the interior, the interior having a bottom wall facing the opening;
    b) creating a component module by arranging a lamination stack of ferromagnetic sheets in the interior of the metallic housing such that the ferromagnetic sheets substantially fill the interior and such that first end edges of the ferromagnetic sheets are supported by the bottom wall and second end edges of the ferromagnetic sheets are exposed at the opening and form a portion of an outer surface of the component module,
    c) protecting locations of the component module where coating is unwanted,
    d) inserting the component module into a hermetic chamber configured to receive an ionized gas,
    e) applying a fixed electric potential to the component module to polarize the component module,
    f) depositing a thin layer of protective coating on the second end edges of the ferromagnetic sheets and on the side wall of the metallic housing through a method of Plasma Enhanced Chemical Vapor Deposition (PECVD) at a temperature lower than 150° C.,
    g) monitoring the deposition homogeneity and deposition thickness of the thin layer of protective coating until desired thickness, and
    h) mechanically rectifying the surface of the thin layer of protective coating to have a uniform protective layer.

2. The method according to claim 1, further comprising a preliminary step of preparing a surface of the component module before inserting the component module into the hermetic chamber.

3. The method according to claim 2, wherein the preliminary step comprises micro sandblasting, or shot blasting, or skimming or chemical attack.

4. The method according to claim 1, wherein the protective coating is between 5 micrometers and 50 micrometers thick.

5. The method according to claim 1, wherein the thin layer of protective coating comprises silicon carbide.

6. The method according to claim 1, wherein the thin layer of protective coating comprises diamond like carbon.

7. The method according to claim 1, wherein arranging the lamination stack of ferromagnetic sheets comprises gluing Si-Iron laminations to one another.

8. The method according to claim 1, wherein the thin layer extends continuously from a first portion of the side wall on one side of the opening across the opening to a second portion of the side wall on another side of the opening.

* * * * *